US011349425B2

(12) United States Patent
Combes et al.

(10) Patent No.: US 11,349,425 B2
(45) Date of Patent: May 31, 2022

(54) ESTIMATION OF THE AMPLITUDE OF A PERIODIC COMPONENT IN A MEASURED SIGNAL THROUGH A DELTA-SIGMA MODULATOR

(71) Applicant: Schneider Toshiba Inverter Europe SAS, Pacy sur Eure (FR)

(72) Inventors: Pascal Combes, Vernon (FR); Dilshad Surroop, Saint-Denis (FR); Philippe Martin, Paris (FR); Pierre Rouchon, Meudon (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 77 days.

(21) Appl. No.: 16/793,689

(22) Filed: Feb. 18, 2020

(65) Prior Publication Data
US 2020/0295693 A1    Sep. 17, 2020

(30) Foreign Application Priority Data
Mar. 12, 2019   (EP) ..................................... 19305291

(51) Int. Cl.
*H02P 23/12*       (2006.01)
*H03H 17/00*       (2006.01)
(Continued)

(52) U.S. Cl.
CPC ............. *H02P 23/12* (2013.01); *H02P 23/14* (2013.01); *H03H 17/0664* (2013.01); *H02P 2203/11* (2013.01); *H03H 2017/0081* (2013.01)

(58) Field of Classification Search
CPC ...... H02P 23/12; H02P 23/14; H02P 2203/11; H02P 21/18; H02P 25/089; H03H 17/0664; H03H 2017/0081; H03H 17/0614
See application file for complete search history.

(56) References Cited

U.S. PATENT DOCUMENTS 7,045,988 B2    5/2006   Ha et al.
9,362,944 B2 *  6/2016   Knapp ................. H03M 3/462
(Continued)

FOREIGN PATENT DOCUMENTS

GB          2314707          1/1998

OTHER PUBLICATIONS

Jebai, Al Kassem, et al., "Sensorless position estimation and control of permanent-magnet synchronous motors using a saturation model", International Journal of Control, 2016, vol. 89, No. 3, pp. 535-549.
(Continued)

*Primary Examiner* — Bickey Dhakal
(74) *Attorney, Agent, or Firm* — Locke Lord LLP

(57) ABSTRACT

A method and device estimate an amplitude of a periodic component in a measured analog signal, e.g. from an electric motor, and adapt a control law for an external entity, e.g., a variable speed drive (VSD) controlling the motor, based on the estimated amplitude. The measured analog signal is converted by delta-sigma modulation to a digital signal that is applied to at least one filter. Periodic signals of independent known periodic functions are also applied to the at least one filter. In response, the at least one filter provides the estimated amplitude of the periodic component in the measured analog signal that may be used to adapt the control law. A monitoring value for the electric motor may also be based on the estimated amplitude of the periodic component.

13 Claims, 2 Drawing Sheets

(51) Int. Cl.
　　　*H02P 23/14*　　　(2006.01)
　　　*H03H 17/06*　　　(2006.01)

(56) References Cited

U.S. PATENT DOCUMENTS

| | | | |
|---|---|---|---|
| 9,784,772 B2* | 10/2017 | Costanzo | ................ H02P 6/183 |
| 2004/0225468 A1 | 11/2004 | McGaughey et al. | |
| 2018/0017604 A1* | 1/2018 | Daw | .................... G01R 31/343 |
| 2018/0109219 A1* | 4/2018 | Huh | ........................ H02P 21/26 |

OTHER PUBLICATIONS

Combes, Pascal, et al., "Adding virtual measurements by signal injection", American Control Conference, 2016, pp. 999-1005.
Yoon, Young-Doo, et al., Sensorless Control for Induction Machines Based on Square-Wave Voltage Injection, IEEE Transactions on Power Electronics, vol. 29, No. 7, Jul. 2014, pp. 3637-3645.
Hammel W., et al., "High-Resolution Sensorless Position Estimation using Delta-Sigma-Modulated Current Measurement", Energy Conversion Congress and Exposition (ECCE), Sep. 17, 2011, pp. 2717-2724.
Extended European Search Report for European Patent Application No. 19305291.7, dated Oct. 8, 2019, 12 pages.

\* cited by examiner

ESTIMATION OF THE AMPLITUDE OF A PERIODIC COMPONENT IN A MEASURED SIGNAL THROUGH A DELTA-SIGMA MODULATOR

TECHNICAL DOMAIN

The invention concerns signal processing, in particular while not exclusively, in the context of control of devices. More particularly, the invention may be used in the context of sensorless control of electrical motors.

BACKGROUND ART

Electrical devices such as motors are generally powered via a variable speed drive connected to a main. Classic voltage/frequency control laws are more and more replaced by sensorless control laws that are able to control both the speed and the torque of the electrical motor, without a mechanical speed or position sensor.

In the context of the present invention, "sensorless" does not refer to the complete absence of sensors but to the absence of some sensors, such as rotor speed or position sensors. It however generally relies on measurements of motor currents (or potentially of motor voltages).

Sensorless control of devices, in particular electric motors, may rely on extraction of information through signal injection, based on a measured variable (such as the current values). High-frequency signal injection consists in superimposing a high-frequency signal to the control signals of electric motors. The measured current response of the motor to this supplementary excitation is then extracted from the current measurement and additional signal processing allows to retrieve the speed or the position of the rotor at low or even zero speed.

The measured signal y(t) can be assumed to be of the form:

$$y(t) = \sum_i y_i(t) s_i(t/\epsilon) + O(\epsilon^p)$$

where:
- $y_i$ are unknown signals (also called amplitudes hereafter) to be estimated;
- $s_i$ are independent known periodic functions of period 1 (normalized time), of class $I_i$ (piecewise) and globally of class $I_{i-1}$;
- $\epsilon \ll 1$ is a known positive parameter; and
- $O(\epsilon^p)$ is a small unknown signal which amplitude is of order $\epsilon^p$ (for some known p).

The unknown signals $y_i$ can then be used to estimate the position of the rotor or its speed, so as to determine the control signal to be applied to the motor.

Some known techniques may be used to retrieve the unknown signals $y_i$:
- Band-pass filtering y(t) to isolate the desired frequency and extract the amplitude of the resulting signal using amplitude calculators such as described in U.S. Pat. No. 7,045,988 B2;
- Using a procedure similar to heterodyning and sliding averages filters, which are basic Finite Impulse Response filters, to obtain the respective amplitudes of the components. This technique is for example described in A. K. Jebai, F. Malrait, P. Martin, and P. Rouchon, "*Sensorless position estimation and control of permanent-magnet synchronous motors using a saturation model*" in International Journal of Control, vol. 89, no. 3, pp. 535-549, 2016, and in P. Combes, A. K. Jebai, F. Malrait, P. Martin, and P. Rouchon, "*Adding virtual measurements by signal injection*" in American Control Conference, 2016, pp. 999-1005.

When using High-Frequency signal injection for sensorless control of electric motors, for example, the desired frequency can be obtained by band-pass filtering of the signal y(t) and by using an arctangent function to retrieve the position of the rotor, as detailed in the document Yoon Y.-D. and Sul S.-K., "*Sensorless Control for Induction Machines Based on Square-Wave Voltage Injection*" in IEEE Transactions on Power Electronics, vol. 29, pp. 3637-3645, 2014.

However, the known techniques suffer from a limited precision and require expensive fast Analog to Digital Converters ADCs, when $\epsilon$ is small, since it is imposed to measure at least two points per period $\epsilon$, according to the Nyquist-Shannon theorem.

This lack of precision and cost problems apply, more generally, to the estimation of amplitudes of periodic signals in a measured signal.

There are therefore needs to improve the estimation of amplitudes of periodic components of a measured analog signal.

SUMMARY OF THE INVENTION

A first aspect of the invention concerns a method for estimating amplitude of a periodic component in a measured signal, wherein the method is performed by a control device comprising at least one filter, the filter being configured to receive a digital signal and a periodic signal as inputs and to output an amplitude signal representative of the periodic signal in the received digital signal, comprising the following operations:
- receiving a measured analog signal;
- performing a delta-sigma modulation on the received analog signal to obtain a digital signal;
- applying the at least one filter to the digital signal and to a first periodic signal to estimate a first amplitude signal.

The method further comprises a control operation of:
- adapting a control law of an external entity based on at least the first amplitude signal; or
- calculating a monitoring value based on at least the first amplitude signal.

Therefore, the invention proposes to use delta-sigma modulators without preprocessing the analog signal, to retrieve an accurate representation of the analog input while being less expensive than other ADCs of similar quality. In addition, galvanic insulation can easily be embedded.

According to some embodiments, the control device comprises at least two filters, including a first filter and a second filter, the first filter is applied to the digital signal and to a first periodic signal, the second filter is applied to the digital signal and to a second periodic signal, and the first and second periodic signals are independent functions.

Therefore, several information can be extracted from the measured analog signal.

In complement, the first and second periodic signals may be orthogonal.

This improves the accuracy of the estimation of the amplitudes.

According to some embodiments, the periodic signal or periodic signals is calculated by a computing unit of the control device based on a clock signal.

This enables to predefine the periodic signals and to increase the responsiveness of the method.

Alternatively, the periodic signal or periodic signals is/are received by the control device from an external device.

This enables to improve the flexibility of the method as different periodic signals can be used over time.

According to some embodiments, the control device is configured to control a variable speed drive in charge of an electric motor, the method comprises, before receiving the measured analog signal, controlling the variable speed drive to inject a motor voltage comprising a control law voltage and an additional voltage component. In that case, the external entity is the variable speed drive.

Therefore, signal injection can be performed to obtain additional information about the electric motor and to enhance the control law of the electric motor.

In complement, the additional voltage component can be a high-frequency component.

This enables to facilitate obtaining the additional information even at low-speed.

According to some embodiments, adapting the control law comprises estimating a rotor position and/or speed based on at least the amplitude signal.

This enables to improve the control of the motor position/speed by the variable speed drive.

According to some embodiments, the monitoring value calculated based on at least the amplitude signal can be:
 a Root Mean Square, RMS, value; and/or
 a Total Harmonic Distortion, THDI, value.

According to some embodiments, the method may further comprise comparing the calculated monitoring value with a preset threshold to decide to issue or not an alert Therefore, an abnormal situation can be automatically detected and signaled.

According to some embodiments, the at least one filter is a Finite Impulse Response Filter, being a linear combination of basic blocks M, basic blocks M being iteratively defined by:

$$M^0(f)(t) = f(t)$$
$$M^{k+1}(f)(t) = \frac{1}{T}\int_{t-T}^{t} M^k(f)(\tau)d\tau$$

where T is an integer multiple of the period of the periodic signals; and where f is a dummy function variable.

A second aspect of the invention concerns a non-transitory computer readable storage medium, with a computer program stored thereon, said computer program comprising instructions for, when executed by a processor, carrying out the steps of a method according to the first aspect of the invention.

A third aspect of the invention concerns a control device comprising:
 a measuring unit configured for receiving a measured analog signal;
 a delta-sigma modulation unit configured to perform a delta-sigma modulation on the received analog signal to obtain a digital signal, at least one estimation unit comprising at least one filter, wherein the filter is configured to receive the digital signal and a first periodic signal as inputs and to output a first amplitude signal representative of the first periodic signal in the received digital signal;
 a control unit configured for:
 adapting a control law of an external entity based on at least the first amplitude signal; or
 calculating a monitoring value based on at least the first amplitude signal, and comparing the calculated monitoring value with a preset threshold to decide to issue or not an alert.

Further objects, aspects, effects and details of the invention are described in the following detailed description of a number of exemplary embodiments, with reference to the drawings.

BRIEF DESCRIPTION OF DRAWINGS

By way of example only, the embodiments of the present disclosure will be described with reference to the accompanying drawings, wherein.

DETAILED DESCRIPTION

Figure 1:
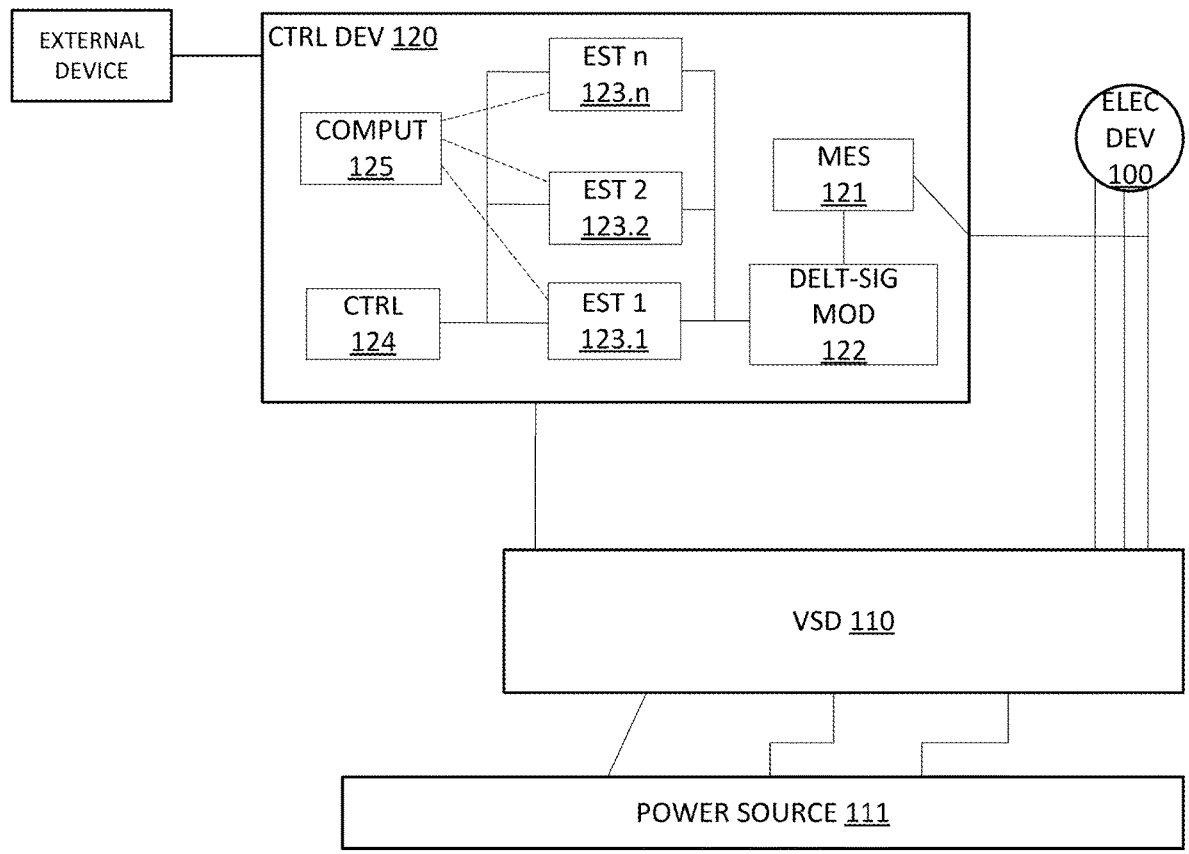
FIG. 1 represents a system according to some embodiments of the invention.

FIG. 1 shows a system according to some embodiments of the invention.

On FIG. 1, a control device 120 according to some embodiments of the invention is included in a system comprising a variable speed drive, VSD, 110 and an electrical motor 100, for illustrative purposes only. According to some embodiments, the control device 120 may be included in the VSD 110. The control device 120 according to the invention may also be used in any other context requiring signal processing of a measured signal to estimate amplitudes of periodic signals within the measured signal.

FIG. 1 depicts some embodiments where the amplitudes are used to adapt the control law of the electrical motor 100. The invention is not restricted to these embodiments. In particular, the unknown signals $y_i$ can be alternatively used to extract harmonics at known frequencies (for example in the context of Root Mean Square RMS value calculation, or Total Harmonic Distortion THDI calculation is sensors) so as to monitor these values.

No restriction is attached to the type of electrical motor, which can be for example a three-phase AC motor, such as a Synchronous Reluctance Motor, SynRM, a Permanent Magnet Synchronous Motor, PMSM, or an Induction machine also known as asynchronous motor.

The VSD 110 can be powered by a power source 111.

The control device 120 may comprise a measuring unit 121, such as current sensors, configured for measuring currents running through the electric motor 100. On FIG. 1, the VSD 100 is powered by a three-phase power source, for illustrative purposes only. In that context, the measuring unit 121 may measure currents on the three phases (or only two of them as the third one can be deduced from the two measured ones).

Alternatively, the measuring unit 121 may be an interface communicating with a measuring unit of the VSD 110, when the VSD comprises such a measuring unit (current sensor) configured for measuring stator current(s). This enables to reduce the cost of the control device 120, and to take advantage of the fact that VSDs are generally equipped with current measurement units.

The signal obtained by the measuring unit 121 is an analog signal.

The control device 120 further comprises a delta-sigma modulation unit 122 that is configured to apply a delta-sigma modulation to the analog signal obtained by the measuring unit 121.

Regular Analog to Digital Converters, ADCs, other than delta-sigma modulators, sample a received analog signal at given instants and output representations of the instantaneous value of the signal over N bits. To sample a signal of a given frequency, the Nyquist-Shannon theorem imposes to have two samples per period, which is called the Nyquist rate.

Delta-sigma modulators are ADCs, which operate at higher frequencies but with a lower precision.

To obtain an accurate measurement from the output signal of the Delta-Sigma modulator (whose frequency is for example 15 MHz and whose resolution is low, for example 1 bit), the measurement can be decimated by 3750 for instance (oversampling ratio), to obtain a signal sampled at lower frequencies (4 kHz in the example).

Delta-sigma modulators yield a high-frequency 1-bit signal (called bitstream), which is proportional in average to the analog input. To retrieve an accurate representation of the analog input, the average over N (oversampling ratio) samples has to be taken.

Delta-sigma modulators have the advantage to be less expensive than other ADCs of similar quality, and galvanic insulation can easily be embedded.

The principle of a delta-sigma modulation is well known and is not further described in the present application.

The control device 120 further comprises at least one estimator 123 connected at the output of the delta-sigma modulation unit 122. On FIG. 1, the control device 120 comprises n estimation units 123.1 to 123.n, n being an integer equal to or greater than 1.

The invention therefore proposes to directly connect the delta-sigma modulation unit 122 with the one or several estimation units 123 without preprocessing.

The estimation units 123 comprise computing capabilities or an electronic circuit that is/are configured to determine, based on a respective periodic signals $s_1(t)$, $s_2(t)$ ... $s_n(t)$, and based on the digital signal $y_{\Delta\Sigma}$ output by the delta-sigma modulation unit 122, amplitude signals $y_i$ corresponding to the respective periodic signals $s_i(t)$. For example, the estimators can be implemented either on an Application Specific Integrated Circuit, ASIC, a Field-Programmable Gate Array, FPGA, or a Digital Signal Processor, DSP.

The periodic signals $s_i(t)$ are provided by the computing unit 125 or alternatively by an external entity. The computing unit 125 may compute the periodic signals $s_i(t)$ based on a clock signal. The computing unit 125 may be integrated in the ASIC, FPGA or DSP mentioned above.

Examples of estimation units 123 are described hereafter, for illustrative purposes only. The estimation units 123 may be identical (but their outputs differ as they are fed with different periodic signals $s_i(t)$) or may be distinct.

The estimation units 123 may comprise filters, such as Finite Impulse Response, FIR, filters, of order 1, 2, 3 or more. In what follows, there is detailed how to construct estimators of orders 1, 2 and 3, which basic building blocks may be iterated sliding averages defined by recurrence as follows:

$$M^0(f)(t) = f(t)$$

$$M^{k+1}(f)(t) = \frac{1}{\varepsilon'} \int_{t-\varepsilon'}^{t} M^k(f)(\tau) d\tau$$

where $\varepsilon'$ is an integer multiple of $\varepsilon$ and f is a placeholder (or dummy) function variable.

A family of FIR filters used in the estimation units 123 may be:

$F^1(f)(t)=M^1(f)(t)$
$F^2(f)(t)=M^2(f)(t)+M^2(f)(t)-M^2(f)(t-\varepsilon')$
$F^3(f)(t)=M^3(f)(t)+4/13\ M^3(f)(t)-4/20\ M^3(f)(t-\varepsilon')+4/7\ M^3(f)(t-2\varepsilon')$ More generally, the used FIR filter may be a linear combination of $M^1, \ldots, M^k$ for which the sum of the coefficients is 1. The coefficients do not depend on the periodic signals $s_i(t)$.

The $s_i(t)$, i varying between 1 and n, are preferably orthogonal, for example orthogonal with respect to a scalar product over the set of 1-periodic functions, i.e.:

$$<\sigma_1|\sigma_2>=\int_0^1 \sigma_1(\tau)\sigma_2(\tau)d\tau=0$$

The estimator $\hat{y}_i$ for the $y_i$ up to $O(\varepsilon^p)$ can be given by:

$$\hat{y}_i=E_i^p(y)=F^p(ys_i).$$

The order p of the filter allows to adjust the accuracy of the estimators (more accuracy when p is high).

The $E_i^p$ can be applied directly to the output $y_{\Delta\Sigma}$ of the delta-sigma modulation unit 122.

An alternative to the above estimator $\hat{y}_i$ can be:

$$\hat{y}_i = \widetilde{E_i^p}(y) = F^p(y - \Sigma_{j=0}^{i-1} \hat{y}_j s_j) s_i)$$

The same estimators in the different estimation units 123.1-123.n can be used, provided that the $s_i(t)$ are made orthogonal. The computing unit 125 is configured to make the $s_i$ orthogonal, if they are originally not (for example, if they are received from an external entity and they are not orthogonal). Original signals $s_i'$ are therefore processed to obtain orthogonal signals $s_i$ and the above formula are applied to the orthogonal signals $s_i$. Once the estimations $\hat{y}_i$ are obtained, the computing unit 125 may further be configured to calculate the estimations $y'_i$, in the original basis of signals $s_i'$.

The filters, applied to the signal $y_{\Delta\Sigma}$ instead of y, estimate $\hat{y}_i$ such that $\hat{y}_i = y_i(t) + O(\varepsilon^p) + o(N^{-k}) + O(N^{-(l+1)})$, where k is the order of the delta-sigma modulation unit 122, N is the oversampling ratio of the delta-sigma modulation unit 122 and $l = \min_i (l_i)$, $l_i$ being the class of the periodic signal $s_i(t)$. The amplitudes $y_i$ can therefore be estimated by the estimation units 123.

For example, in the context of signal injection for sensorless control of the motor 100 at low speed, the measured currents may be expressed as:

$$y(t) = y_0(t) \cdot 1 + \varepsilon y_1(t) \cdot s_1\left(\frac{t}{\varepsilon}\right) + O(\varepsilon^2)$$

when considering a second order expansion, or $$y(t) = y_0(t) \cdot 1 + \epsilon y_1(t) \cdot s_1\left(\frac{t}{\epsilon}\right) + \epsilon^2 y_2(t) \cdot s_2\left(\frac{t}{\epsilon}\right) + O(\epsilon^3)$$

when considering a third order expansion.

The knowledge of $y_0$ and $y_1$ (and optionally of $y_2$) may be used as parameters for the design of the VSD 110 control laws.

$y_0$, $y_1$ (and $y_2$) can be determined with accuracy using the low-cost delta-sigma modulation unit 122, even if $1/\epsilon$ is larger than the effective Nyquist frequencies of the $y_i$.

Once the amplitudes $y_i$ has or have been obtained, they are transferred to the control unit 124. The control unit 124 may be configured to:
- adapt the control law of the VSD 110 based on the amplitude(s) $y_i$, by optionally determining the speed and position of the rotor based on the amplitude(s) $y_i$; and/or
- the amplitude signals $y_i$ can be alternatively used to extract harmonics at known frequencies, for example in the context of the calculation of a monitoring value, such as Root Mean Square RMS value, or Total Harmonic Distortion THDI, so as to monitor this value. As an example, the control unit 124 may further calculate the THDI and compare it with a preset threshold. Based on the result of the comparison, an alert may be generated, in particular if the THDI exceeds the preset threshold.

To this end, the control unit 124 may comprise a processor, a memory (RAM, ROM, flash memory, etc.) and an output interface for controlling the VSD 110 or for issuing and transmitting an alarm signal.

An example of sensorless control of a motor of the SynRM type, using signal injection, is described hereafter.

A model of the SynRM motor can be given by:

$$\frac{d\phi_{SDQ}}{dt} = \mathcal{R}(-\theta)u_{S\alpha\beta} - R_s L^{-1}\phi_{SDQ} - J\omega\phi_{SDQ}$$

$$\frac{d\theta}{dt} = \omega$$

$$I_{S\alpha\beta} = \mathcal{R}(\theta)L^{-1}\phi_{SDQ}$$

where $\mathcal{R}(\theta)$ is a rotation function of angle theta in positive trigonometric direction.

The state of the motor is described by $\phi_{SDQ}$, which is the vector of the stator flux in a rotor-oriented DQ frame, and $\theta$, which is the angular position of the rotor.

The vector of stator voltages in a stationary $\alpha\beta$ frame, noted $u_{S\alpha\beta}$ is the control input, while $\omega$, the rotor speed, is a disturbance input, which is to be obtained to achieve a proper control of the SynRM motor.

When sensorless control is used, the sole available measurement is the vector of stator currents in the stationary $\alpha\beta$ frame, noted $I_{S\alpha\beta}$.

Parameters of the model are the resistance $R_s$ of the stator and the matrix of inductances $$L = \begin{pmatrix} L_D & 0 \\ 0 & L_Q \end{pmatrix}.$$

When signal injection is used, the vector of stator voltages is:

$$u_{S\alpha\beta}(t) = \bar{u}_{S\alpha\beta}(t) + \tilde{u}(t/\epsilon),$$

where $\tilde{u}(t/\epsilon)$ is a high-frequency disturbance that is voluntarily superimposed on the control voltage vector $\bar{u}_{S\alpha\beta}$. The high-frequency disturbance in the voltage vector creates a high-frequency in the stator flux, which becomes $\phi_{SDQ} = \bar{\phi}_{SDQ} + \epsilon \mathcal{R}(-\theta)\tilde{U}(t/\epsilon)$ and in turn creates a disturbance in the measured current, which becomes:

$$I_{S\alpha\beta} = \bar{I}_{S\alpha\beta} + \underbrace{\epsilon \mathcal{R}(\theta)L^{-1}\mathcal{R}(-\theta)}_{\mathcal{S}(\theta)}\tilde{U}\left(\frac{t}{\epsilon}\right) + O(\epsilon^2)$$

where $\tilde{U}$ is the zero-mean primitive of $\tilde{u}$ and the undisturbed variables follow the original model:

$$\frac{d\bar{\phi}_{SDQ}}{dt} = \mathcal{R}(-\theta)\bar{u}_{S\alpha\beta} - R_s L^{-1}\bar{\phi}_{SDQ} - J\omega\bar{\phi}_{SDQ}$$

$$\frac{d\theta}{dt} = \omega$$

$$\bar{I}_{S\alpha\beta} = \mathcal{R}(\theta)L^{-1}\bar{\phi}_{SDQ}$$

Estimating $\bar{I}_{S\alpha\beta}$ and $\mathcal{S}(\theta)$ (respectively corresponding to $y_0$ and $y_1$ mentioned above) using the invention detailed above, allows to retrieve theta from $\mathcal{S}(\theta) = \mathcal{R}(\theta)L^{-1}\mathcal{R}(-\theta)$ and use it together with $\bar{I}_{S\alpha\beta}$ to compute $\tilde{u}_{S\alpha\beta}$ in the control law.

Figure 2:
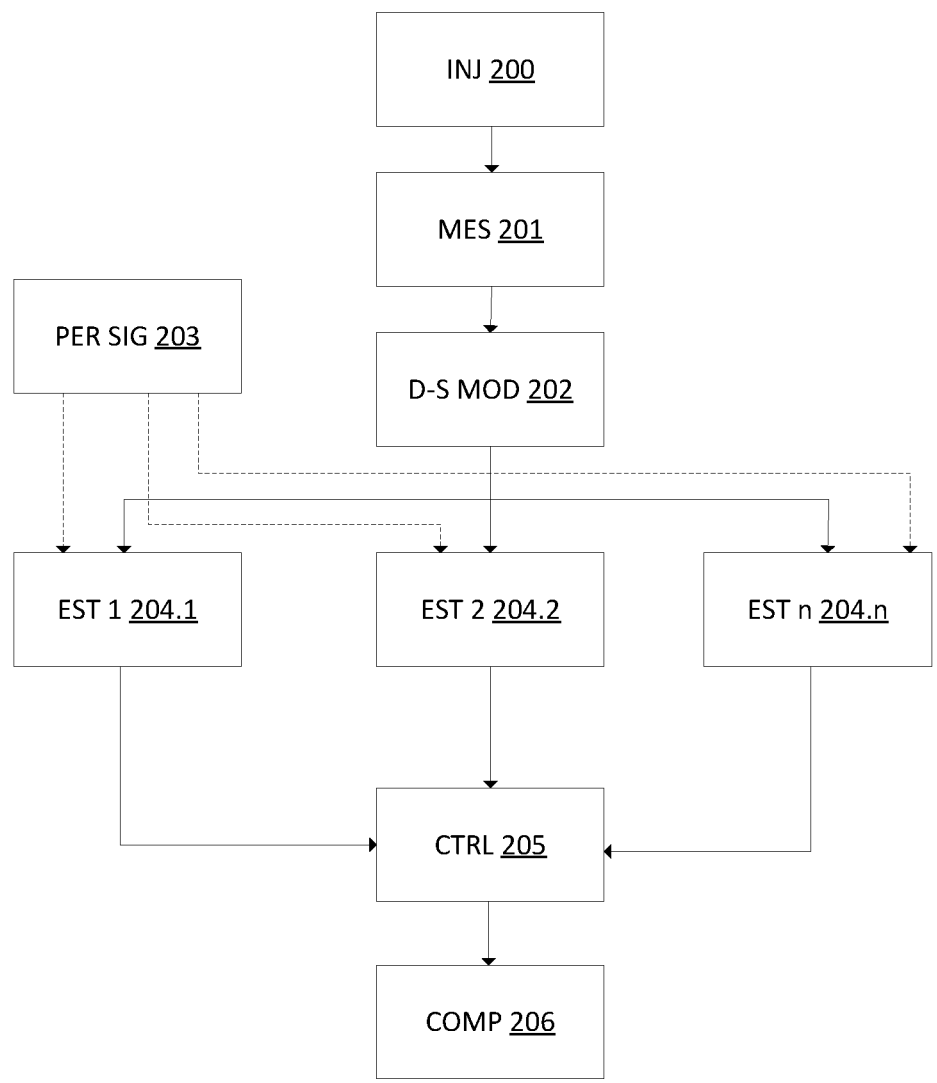
FIG. 2 is a flowchart showing the steps of a method according to some embodiments.

FIG. 2 is a diagram showing the steps of a method according to some embodiments of the invention.

At a step 200, the VSD 110 can be controlled (by the control device 120 or by any other entity) to inject a motor voltage or motor voltages depending on a control law voltage and an additional voltage component, such as a high-frequency component for example. This step only applies in the context of signal injection, and is not performed when the invention is used for other purposes such as extraction of harmonics.

At step 201, the measuring unit 121 acquires an input signal such as measurements of the current (or currents for different phases) flowing through the motor 100. The input signal is an analog signal.

At step 202, the analog input signal y is processed by the delta-sigma modulation unit 122 to obtain the digital signal $y_{\Delta\Sigma}$.

At step 203, in parallel to step 202, the one or several periodic signals $s_i(t)$ is/are computed or received from an external entity.

At one or several steps 204.1-204.n, each of the estimation units 123 estimates a signal $y_i$ based on the periodic signal received/computed at step 203 and based on the digital signal $y_{\Delta\Sigma}$.

At step 205, the control unit 124 adapts the control law of the VSD 110 and/or extracts harmonics at known frequencies to compute a monitoring value, for example to calculate RMS or THDI as explained above.

The calculation of RMS or THDI can be followed by an optional step 206 of comparison of the RMS or THDI value with a preset threshold, and an alarm can be generated based on the result of the comparison, as explained above.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments.

The invention claimed is:

1. A method for estimating amplitude of a periodic component in a measured signal, wherein the method is performed by a control device comprising at least one filter, wherein the filter is a Finite Impulse Response filter, comprising the following operations:
   receiving a measured analog signal of the form of a sum of products of amplitude signals and periodic signals, wherein the amplitude signals are unknown signals to be estimated and the periodic signals are independent known periodic functions;
   performing a delta-sigma modulation on the received analog signal to obtain a digital signal;
   applying the at least one filter to the product of the digital signal and to a first periodic signal to estimate a first amplitude signal representative of the first periodic signal in the received digital signal, the first amplitude signal corresponding to the estimation of an unknown signal;
   wherein the method further comprises a control operation of:
   adapting a control law of an external entity based on at least the first amplitude signal; or
   calculating a monitoring value based on at least the first amplitude signal.

2. The method according to claim 1, wherein the control device comprises at least two filters, including a first filter and a second filter,
   wherein the first filter is applied to the digital signal and to a first periodic signal,
   wherein the second filter is applied to the digital signal and to a second periodic signal,
   wherein the first and second periodic signals are independent functions.

3. The method according to claim 2, wherein the first and second periodic signals are orthogonal.

4. The method according to claim 1, wherein the periodic signal or periodic signals is calculated by a computing unit of the control device based on a clock signal.

5. The method according to claim 1, wherein the periodic signal or different periodic signals are received over time by the control device from an external device.

6. The method according to claim 1, wherein the control device is configured to control a variable speed drive in charge of an electric motor,
   wherein the method comprises, before receiving the measured analog signal, controlling the variable speed drive to inject a motor voltage comprising a control law voltage and an additional voltage component;
   wherein the external entity is the variable speed drive.

7. The method according to claim 6, wherein the additional voltage component is a high-frequency component.

8. The method according to claim 6, wherein adapting the control law comprises estimating a rotor position and/or speed based on at least the amplitude signal.

9. The method according to claim 1, wherein the monitoring value calculated based on at least the amplitude signal is:
   a Root Mean Square, RMS, value; and/or
   a Total Harmonic Distortion, THDI, value.

10. The method according to claim 1, further comprising comparing the calculated monitoring value with a preset threshold to decide to issue or not an alert.

11. The method according to claim 1, wherein the at least one filter is a Finite Impulse Response Filter, being a linear combination of basic blocks M, basic blocks M being iteratively defined by:

$$M^0(f)(t) = f(t)$$
$$M^{k+1}(f)(t) = \frac{1}{T}\int_{t-T}^{t} M^k(f)(\tau)d\tau$$

where T is an integer multiple of the period of the periodic signals; k is the order of the filter, and where f is a dummy function variable.

12. A non-transitory computer readable storage medium, with a computer program stored thereon, said computer program comprising instructions for, when executed by a processor, carrying out the steps of a method according to claim 1.

13. A control device comprising:
   a measuring unit configured for receiving a measured analog signal of the form of a sum of products of amplitude signals and periodic signals, wherein the amplitude signals are unknown signals to be estimated and the periodic signals are independent known periodic functions;
   a delta-sigma modulation unit configured to perform a delta-sigma modulation on the received analog signal to obtain a digital signal;
   at least one estimation unit comprising at least one filter, wherein the filter is a Finite Impulse Response filter and is configured to receive the product of the digital signal and a first periodic signal as inputs and to output a first amplitude signal representative of the first periodic signal in the received digital signal, the first amplitude signal corresponding to the estimation of an unknown signal;
   a control unit configured for:
   adapting a control law of an external entity based on at least the first amplitude signal; or
   calculating a monitoring value based on at least the first amplitude signal, and comparing the calculated monitoring value with a preset threshold to decide to issue or not an alert.

* * * * *